(12) United States Patent
Niggemann (10) Patent No.: US 8,865,504 B2
(45) Date of Patent: Oct. 21, 2014

(54) PATTERNING (75) Inventor: Michael Niggemann, Cambridge (GB)

(73) Assignee: Cambridge Enterprise Limited (GB)

( * ) Notice: Subject to any disclaimer, the term of this patent is extended or adjusted under 35 U.S.C. 154(b) by 112 days.

(21) Appl. No.: 13/808,166

(22) PCT Filed: Apr. 7, 2011

(86) PCT No.: PCT/GB2011/051258
§ 371 (c)(1),
(2), (4) Date: May 3, 2013

(87) PCT Pub. No.: WO2012/004589
PCT Pub. Date: Jan. 12, 2012

(65) Prior Publication Data
US 2013/0210184 A1 Aug. 15, 2013

(30) Foreign Application Priority Data

Jul. 5, 2010 (GB) .................................. 1011280.3

(51) Int. Cl.
*H01L 21/00* (2006.01)
(52) U.S. Cl.
USPC ......................................... 438/57; 156/345.2
(58) Field of Classification Search
CPC ..... H01L 51/00; H01L 51/007; H01L 51/014; H01L 51/017
USPC ........................................................... 438/57
See application file for complete search history.

(56) References Cited

U.S. PATENT DOCUMENTS

| | | | | |
|---|---|---|---|---|
| 4,259,055 A * | 3/1981 | O'Brien | ..................... | 425/382.4 |
| 4,343,662 A | 8/1982 | Gay | | |
| 5,536,313 A * | 7/1996 | Watanabe et al. | ............. | 118/303 |
| 6,436,190 B1 * | 8/2002 | Akagi | ........................... | 118/419 |
| 6,726,958 B2 * | 4/2004 | Kawabe | ........................ | 427/356 |
| 7,105,203 B1 * | 9/2006 | Masuda et al. | ................ | 427/286 |
| 7,255,896 B2 * | 8/2007 | Kawabe | ........................ | 427/318 |
| 2003/0221718 A1 | 12/2003 | Kubo et al. | | |
| 2005/0129977 A1 * | 6/2005 | Poon et al. | ..................... | 428/690 |
| 2005/0279996 A1 * | 12/2005 | Takubo et al. | ................. | 257/40 |
| 2006/0160266 A1 * | 7/2006 | Bernds et al. | ................... | 438/99 |
| 2006/0202612 A1 * | 9/2006 | Poon et al. | ..................... | 313/504 |
| 2007/0200489 A1 * | 8/2007 | Poon et al. | ..................... | 313/502 |

* cited by examiner

*Primary Examiner* — Reema Patel
*Assistant Examiner* — Syed Gheyas
(74) *Attorney, Agent, or Firm* — Hartman Global IP Law; Gary M. Hartman; Michael D. Winter (57) ABSTRACT

A method for patterning an article, the article comprising a first layer of a first material, a first major surface of the first layer being in intimate contact with some or all of a first major surface of a second layer of a second different material the method comprising providing a first thread carrying a first species to remove at least a portion of the first layer, and providing a second thread aligned with and adjacent the first thread and contacting the first and second threads with the first layer to remove at least part of the first layer.

17 Claims, 7 Drawing Sheets

PATTERNING

The present invention relates to methods and apparatus for patterning articles such as electronic, e.g. photovoltaic devices and methods and apparatus for their construction.

Electronic devices such as photovoltaic thin film modules consist of functional layers of a defined geometry that are positioned with respect to one another such that a photovoltaic module is formed. These functional layers are typically charge carrier extraction layers, photoactive layers for accepting electromagnetic radiation and outputting electrical energy and electrode layers.

A photovoltaic module consists of a number of individual photovoltaic cells connected together. These individual cells may be connected in series or in parallel to each other. Higher output voltages may typically achieved by electrically connecting the cells in series.

Photovoltaic modules such as thin film photovoltaic modules are sometimes fabricated as a monolithic array of cells. Rather than wiring individual cells together (as is sometimes performed for, say, crystalline solar modules), the monolithic interconnection of thin film modules may be achieved either by producing a substrate substantially covered by the necessary functional layers and patterning those functional layers to produce a network of individual cells on the substrate or by directly printing the functional layers to the substrate in the desired pattern.

As is clear to the skilled person, the relative ease of manufacture of a monolithic module provides a cheaper alternative to electrically connecting an array of individual wafers. However, known methods for producing monolithic arrays have limitations which may have a detrimental effect on the quality of finished photovoltaic modules.

In order to maximise the power conversion efficiency of photovoltaic modules, it is necessary to ensure a high homogeneity of the film thickness, that thickness usually being in the order of ten to several hundred nanometers, and a high resolution edge definition, the edge being in the order of a few microns.

Printing techniques such as gravure printing enable the deposition of a patterned thin film in a single process step. However, not all layers of a device can be deposited by printing techniques. For example, some vacuum deposited transparent electrodes (ITO) or highly reflective metal electrodes may not typically be deposited by printing techniques. High film quality with regard to a high homogeneity and a low defect density (e.g. pinhole density) may, for example, be achieved by coating techniques rather than by printing techniques such as gravure printing. The cell volumes in the gravure structure of printing cylinders must be relatively large to produce functional layers of the required thickness, because of the low solid content of the solutions caused by the limited solubility of some of the components. High cell volumes result in large cells in the order of several tens of micrometers, meaning that the edge resolution of gravure to non-gravure areas is limited. As a consequence the formation of straight uniform printing edges on the order of micrometers is unlikely.

In addition, the thickness of a printed area will always vary starting from the edge towards the centre of the printed layer. The length of this variation depends on the rheological properties of the material, the drying conditions and the surface tension of the substrate. A deviation from the optimum film thickness will result in lower power conversion efficiencies and is therefore unfavourable.

Coating techniques such as slot-die coating or blade coating typically offer highly uniform functional layers. However these layers are either not patterned or include patterning with coarse resolutions, e.g. requiring mm scales for stable gap sizes. Thus post-processing is usually required to produce the required array of cells on the substrate.

Such patterning steps include laser scribing which may be useful for patterning organic and inorganic layers in e.g. organic solar cell modules. Laser scribing uses one or more lasers to ablate the functional layers of the substrate to create the desired pattern. However, typically the laser ablates all of the functional layers on the substrate (and might also damage or otherwise affect the substrate), where it may actually be desired to ablate only one or some of the layers.

While the selective patterning of only certain layers by laser scribing is possible, it relies, particularly when the layers are thin, upon the individual layers having sufficiently distinct absorption characteristics and the according use of lasers of different wavelengths to ablate each layer. Moreover, lasers are likely to damage the underlaying barrier layers (for example layers of SiN, $Al_2O_3$ or $SiO_2$ between the substrate and electrode), and the equipment is relatively expensive, especially where a plurality (or even tunable lasers) are required.

Mechanical scribing, such as the use of hardened steel tips to remove layers from a thin film, is also used to pattern e.g. inorganic thin film modules and organic photovoltaic modules. However significant disadvantages include the destruction of underlying surfaces, remaining traces of organic components (which may be critical in areas that will be utilized for electrical interconnects, as a subsequently coated electrode layer may suffer from a high electrical interface resistance caused by partially removed organic layers), and the production of particles that may cause damage in the subsequent deposition and encapsulation processes.

The present invention addresses these issues by providing a method and means for patterning a substrate coated with one or more functional layers.

In a first aspect, the invention provides a method for patterning an article, the article comprising a first layer of a first material, a first major surface of the first layer being in intimate contact with some or all of a first major surface of a second layer of a second different material the method comprising providing a first thread carrying a first species, e.g. a solvent in which the first material has a relatively high solubility and the second material has a relatively low solubility, providing a second thread adjacent, and preferably aligned with, the first thread and contacting the first and second threads with the first layer to remove at least part of the first layer.

The inventors have found that, by using threads to describe patterns onto layers of electronic devices or their precursors, a high degree of accuracy and uniformity in the edges so produced is afforded.

Preferably, the thread or threads comprise continuous elongate flexible members, for example having a cross sectional aspect ratio between 0.6 and 1.4, e.g. 0.7 and 1.3, say 0.8 and 1.2 or 0.9 and 1.1, preferably 1, when not in contact with the article, or values between the upper and lower limits. The threads may be formed from natural or artificial materials, for example cotton, silk, wool, cashmere, hemp, jute, polyester, polyamides, PTFE, or other plastics. The or some of the threads may be in the form of yarns, say spun or filament yarns. Spun yarn is made by twisting or otherwise bonding staple fibers together to make a cohesive thread. The fibers can consist of synthetic (Polymer fibers (polyamide, polyester, acrylic polyesters, polyethylene etc. . . . )), natural (cotton, silk, wool, angora, cashmere, etc.) or blends of these materials, e.g. Cotton-polyester, wool-acrylic. Alternatively the thread can be a filament yarn that consists of filament fibers (very long continuous fibers) either twisted together or only grouped together. Alternatively the thread can consist of a mono filament that carries the respective solvent via a swelling process.

Preferably, the first species on the first thread has no or limited capacity to remove some or all of the second layer.

Preferably, the second thread carries a second species, for example a second solvent or solvent mixture, where the or a second layer adjacent the first layer comprises a second material having a relatively high solubility in the second solvent or solvent mixture relative to its solubility in the first solvent, the method comprising contacting the second thread with the first layer to remove at least part of the first layer, and contacting the second thread with the second layer to remove at least part of the second layer.

Preferably, the first layer comprises a hole collection compound and the first solvent comprises a solvent or solvent mixture suitable for solvating the hole collection layer, such as isopropanol, ethanol and/or water.

Preferably, the first layer comprises a photoactive layer and the first solvent comprises a solvent or solvent mixture suitable for solvating the photoactive layer, e.g. xylene and/or toluene.

Preferably, the second layer comprises a photoactive layer and the first solvent comprises a solvent or solvent mixture suitable for solvating the or a hole collection layer but not the photoactive layer, such as isopropanol, ethanol and/or water.

Preferably, the second layer comprises a hole collection compound and the first solvent comprises a solvent or solvent mixture suitable for solvating the or a photoactive layer but not the hole collection layer, a non-polar solvent such as xylene and/or toluene.

Solvents may be polar or non-polar and may be selected according to the solubility requirements of the individual compound or compounds in each layer. Solvents may include hydrogen bonding solvents such as water, non-polar solvents such as xylene or toluene, and polar solvents such as alcohols (e.g. isopropanol, ethanol, methanol and the like), ketones (e.g. acetone, methyl ethyl ketone, etc.), acetates, ethers, alkyl halides (e.g. methylene chloride).

In some embodiments, the method comprises removing the first thread from contact with the device or precursor, depositing a third different material onto the device or precursor to create a third layer adjacent the first layer, and removing the second thread to leave a channel through the first, second and third layers.

Preferably, the third material is deposited by a method selected from spray coating, ultra sonic spray coating, ink-jet printing, blade coating, screen printing, reverse gravure coating, gravure printing, off-set printing, slide coating, curtain coating, dip coating.

Preferably, the third material comprises a material selected from metals, metal oxides, semiconductors (doped or undoped), or precursors, nanoparticles or microparticles thereof, graphenes, carbon black, carbon nanotubes.

Preferably, the method further comprises applying a passivating material to the so-formed channel.

Preferably, the passivating material is applied to cover an exposed bottom electrode, the bottom electrode preferably comprising a charge injection layer and conductor layer.

Preferably, the passivating material is a dielectric material and/or oxidising agent.

Preferably, the method further comprises applying a conducting material into the so-formed channel.

Preferably, the conducting material is applied so as to provide a conducting path between layers either side of the so-formed channel.

Preferably, the method comprises providing electrical contact between the top and bottom electrode of cell elements either side of the channel to form a series interconnection of these cell elements.

Preferably, the conducting material comprises a material selected from metals, metal inks, highly doped organic or inorganic conductors or precursors, nanoparticles or microparticles thereof, graphenes, carbon black, carbon nanotubes.

Preferably, the method comprises contacting a third thread, aligned with and adjacent to the first thread, with the first layer.

Preferably, the second thread and the or a third thread carry a third solvent in which the first material has a relatively low solubility as compared to its solubility in the first solvent.

Preferably, the threads are contacted with the first layer when the first layer is not solid (e.g. prior to drying and/or curing).

Preferably, a or the second species, e.g. solvent or solvent mixture is applied to the second thread in a plurality of second portions.

Preferably, the first and second portions may alternate (e.g. in a contiguous fashion) or may be separated by one or more further portions, or a combination thereof.

Preferably, the first and second species are applied to the second thread application means such as dispensers, ink jet printing heads, gravure rolls, dipping, brushing, spraying and so on.

In another aspect, the invention provides a method of forming an article, the method comprising applying one or more sequential layers to a substrate to provide a layered article, removing at least some parts of the or at least one of the layers by bringing a plurality of adjacent threads into contact with the layered article, a first of the adjacent threads carrying a first material to cause removal of the material forming the at least one layer.

In a further aspect, the invention provides a method for manufacturing an article, e.g. an electronic device, comprising providing a substrate having a first major surface, contacting at least a portion of a thread with at least a portion of the first major surface, applying a coating to at least part of the first major surface and removing the thread from the first surface to leave a channel in the coating.

Preferably, the coating is applied by a method selected from spray coating, ultra sonic spray coating, ink-jet printing, blade coating, screen printing, reverse gravure coating, gravure printing, off-set printing, slide coating, curtain coating, dip coating Preferably, the coating comprises a material selected from metals, metal inks, highly doped organic or inorganic conductors, or precursors, nanoparticles or microparticles thereof, graphenes, carbon black, carbon nanotubes In a further aspect, the invention provides a method for patterning an article, e.g. an electronic device or precursor thereof, the method comprising contacting a thread carrying a first material with a substrate, the first material capable of forming a self-assembled monolayer on the surface of the substrate.

Preferably, the first material comprises a haloalkysilane.

In a further aspect, the invention provides a method for patterning an electronic device or precursor thereof, the device comprising a metallic or metallic oxide layer, the method comprising contacting a conductive thread carrying an electrolyte with the metallic or metallic oxide layer while passing an electric current through the thread.

Preferably, the thread or one or more of the threads or segments of the threads comprise one or more materials selected from natural or artificial materials.

Preferably, the thread or one or more of the threads have a diameter or longest cross-sectional dimension between 1 micrometer and 10 mm.

Preferably, the thread or one or more of the threads has a substantially regular, for example, circular, elliptical, oval, triangular, rectangular, square, oblong, pentagonal or hexagonal or irregular cross sectional profile.

Preferably, the method of the invention is performed as at least part of a continuous, preferably automatic, process.

In another aspect, the invention provides an apparatus for patterning an electronic device, the apparatus comprising a first thread and at least two movable guides for mounting the first thread and providing a region of the first thread for contacting an article, where first and second movable guides comprise rollers for moving the first thread in a lengthwise direction, and further comprising a third movable guide, which in concert with the first movable guide or a fourth movable guide, provides means for mounting and moving a second thread lengthwise and/or providing a region of the second thread for contacting the article.

Preferably, the movable guides are movable, preferably continuously and/or automatically movable, to adjust the contact position of the or each thread with the article.

Preferably, the apparatus further comprises a means for applying a substance to the first thread before it contacts an article.

Preferably, the apparatus further comprises a means for applying a substance to the second thread before it contacts an article.

Preferably, the apparatus comprises a means for applying a material to the article before, during and/or after the first thread contacts the article.

Preferably, the means for applying material to the first and/or second threads comprise one or more gravure rolls.

Preferably, the apparatus comprises a roller or curved surface for mounting the article during contact with the thread.

Preferably, the article comprises a web of material, the roller or curved surface guiding or capable of guiding the web thereabout.

Preferably, the guides are operable to bring the thread into contact with the web as the web is guided about the roll.

In a further aspect, the invention provides a thread for patterning an article, the thread having one or more first portions and one or more second portions, the thread carrying a first liquid in or on the first portions and carrying none of the first liquid in or on the second portions.

Preferably, the thread further carries a second liquid in or on the second portion.

Preferably, the thread has one or more third portions carrying neither the first nor second liquids.

Preferably, the thread has a regular or irregular array of portions, different species being carried on or in different portions.

In a further aspect, the invention provides an apparatus for patterning an electronic device, the apparatus comprising at least two adjacent threads and means to bring the threads into contact with a surface to be patterned.

Preferably, the apparatus further comprises means to apply a species to one or other of the threads to allow one or other of the threads to effect patterning of a first layer of an electronic device.

Preferably, the apparatus further comprises means to apply a species to the other of the first and second threads to allow the other of the two threads to effect patterning of a second layer of an electronic device.

Preferably, the apparatus further comprises means to apply a species to the other of the first and second thread, which second species prevents or inhibits the first species from moving away from the contact area of its respective thread.

Preferably, two, some or all of the threads abut each other in use.

Embodiments of the invention will now be described by way of example only and with reference to the following drawings.

Figures 1A, 1B, 1C:
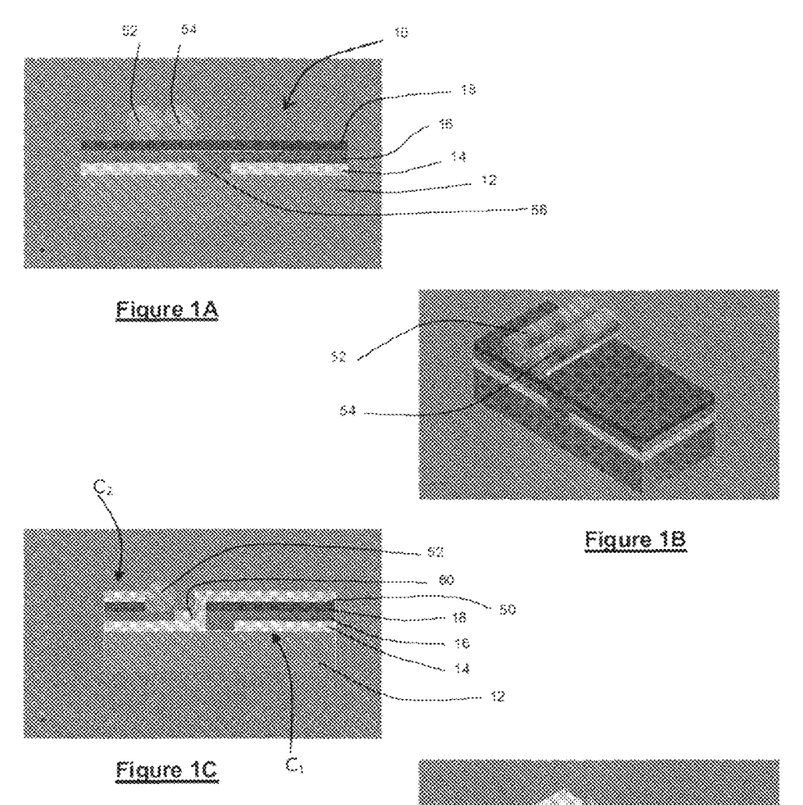
FIGS. 1A to D show steps of a method according to the invention.
Figure 1D:
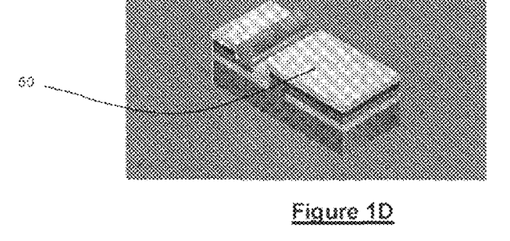

A first embodiment of the invention is described in relation to FIG. 1. A web 10 is provided, the web comprising sequentially and in series a substrate 12, a first electrode layer comprising a transparent electrode, a photoactive layer 14 and a hole collection layer 18.

The electrode layer 14 may comprise a metal layer such as chromium and/or aluminium, for example a chromium/aluminium/chromium electrode. The electrode layer 14 may also be a transparent layer, for example comprising indium tin oxide, or some other a metal-oxide/metal/metal-oxide layer system coated with a specific oxide providing an ohmic contact for efficient electron injection. Such specific contact could be formed from TiOx or ZnOx (either doped or intrinsic) deposited by vacuum processing or as nanoparticle from solution.

The photoactive layer may be a blend of a conjugated polymer and a fullerene derivative such as a blend of poly(3-hexylthiophene) and [6,6]-phenyl C61-butyric acid methylester (P3HT:PCBM). P3HT, the main absorber in this photoactive 25 composite has a band gap of around 2.1 eV and absorbs wavelengths of up to around 650 nm.

Alternatively, the photoactive layer may comprise a blend of two conjugated polymers one presenting the donor and one the acceptor.

Other suitable photoactive layers may comprise: p-phenylenevinylene-based 5 conjugated polymers such as (poly (2-methoxy-5-((3',7'-dimethyloctyl)oxy)-1,4-phenylenevinylene) (MDMO-PPV,); fluorene-based conjugated polymers, e.g. 2,1,3-benzothiadiazole-containing PF, poly(9, 9-dioctylfluorene-2,7-diyl-alt-4,7-bis(3-hexylthien-5-yl)-2, 1,3-benzothiadiazole-2',"2-diyl).

The hole collection layer 18 comprises a hole collection compound such as poly(3,4-ethylenedioxythiophene)-poly (styrene sulfonate) ((PEDOT)-PSS) or polyaniline-poly(styrene sulfonate) (Pani). Alternative hole collection compounds include metal oxides such as $MoO_3$, NiO, or $V_2O_5$.

A second electrode 50, for example comprising nanometer or micron sized particles of silver which provide high sheet conductivity, may be added and a divide and stepped series connection between adjacent cells added in few short steps.

Firstly, a pair of threads 52, 54 are arranged adjacent to and parallel to each other and contacted with the surface of, say, the hole collection layer, slightly to one side of a break 56 in the first electrode layer 14. The first thread 52 is saturated in a solvent, such as isopropanol or water or a mixture of isopropanol and water, in which the hole collection layer 18 has a greater solubility than the photoactive layer 16. The second thread 56, however, is saturated in a mixture of solvents e.g. a 50:50 (wt:wt) mixture of isopropanol and xylene which is able to solvate both the hole collection layer 18 and the photoactive layer 16, but will not significantly damage or solvate the first electrode layer 14.

The threads 52, 54 are dragged across the surface of the hole collection layer 18 such that the first thread 52 removes hole collection material to provide a channel through the hole collection layer 18 without removing, or at least only partially removing, the photoactive layer 16 below, and such that the second thread 54 removes both hole collection material and photoactive material to provide a channel through the hole collection layer 18 and the photoactive layer 16, without damaging the first electrode layer 14 below.

Figure 4:
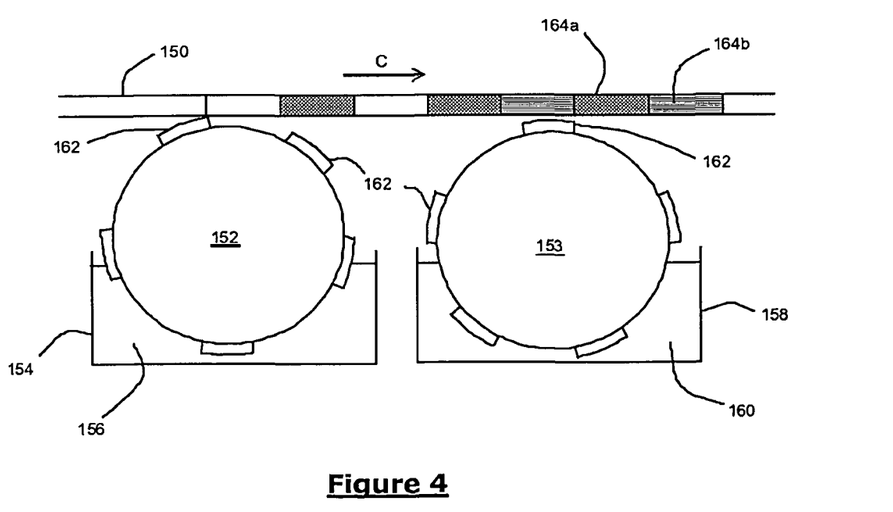
FIG. 4 shows steps of a method according to the invention.

The second thread 54 is moved away from the web 10, while the first thread 53 remains in a position contacting the photoactive layer 16, as shown in FIG. 4C. The first thread 52 is thereby able to act as a mask for the introduction of a second electrode layer 50, which second electrode layer 50 may be formed by, for example, spraying a solution of silver nanoparticles onto the web 10.

The finished pattern provides a divide between a pair of cells $C_1$ and $C_2$ having a series connection 60 between the first electrode layer 14 of the cell $C_1$ and the second electrode layer 50 of the cell $C_2$.

Figure 2:
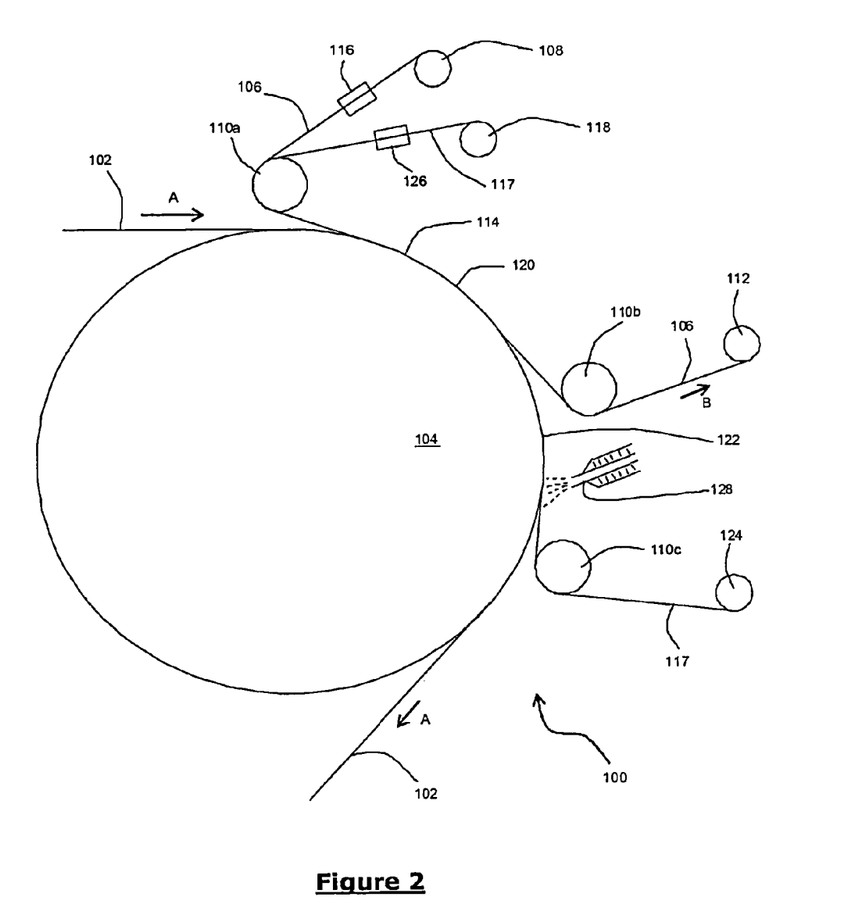
FIG. 2 shows apparatus according to the invention.

This process could be simply automated by modification of a system 100 as shown in FIG. 2. A continuous web 102 is conveyed over a roller 104 in a direction A, at a speed v. The web 102 comprises in series a substrate 12, a first electrode layer comprising a transparent electrode, a photoactive layer 14 and a hole collection layer 18.

Meanwhile, a first thread 106 is loaded onto a pair of movable rollers or thread guides 110a, 110b, such that it can be unwound from a first bobbin 108, pass around the first movable roller 110a, and then around the second movable roller 110b, leaving a section 114 of thread therebetween for contacting the web 102, before finally being wound onto a second bobbin 112. The thread guides or movable rollers 110a,b provide highly accurate alignment of the thread. The first thread 106 is wound in a second direction B at a second speed $s_1$, preferably being greater than first speed v.

A first chemical bath 116 is positioned between the first bobbin 108 and the first movable roller 110a to apply a solvent mixture capable of solvating both the hole collection layer 18 and the photoactive layer 14 to the first thread 106.

A second thread 117 is loaded onto the first movable roller 110a and a third movable roller 110c, such that it can be unwound from a third bobbin 118, pass around the first movable roller 110a, and then around the third movable roller 110c, leaving a first section 120 of thread parallel to and contiguous with the section 114 of the first thread 106 contacting the web 102. A second section 122 of the second thread 117 contacts the web 102 between the second roller 110b and the third roller 110c before the second thread 117 is finally wound onto a fourth bobbin 124. The second thread 117 is wound in the second direction B at a second speed $s_2$, preferably being greater than first speed v. In some embodiments $s_1$ will have the same vector quantity as $s_2$ but need not in other embodiments, in fact one or other may be zero.

A second chemical bath 126 is positioned between the third bobbin 118 and the first movable roller 110a to apply a solvent capable of solvating both the hole collection layer 18 but not the photoactive layer 14 to the second thread 117.

A spray coating nozzle 128 is positioned to apply a silver nanoparticle solution to the web 102 at the section 122 between the second 110b and third 110c movable rollers.

In use, the web 102 is passed across the roller 104 in direction A at speed v, the first thread 106 is wound across the movable rollers 110a, 110b in direction B at speed $s_1$ and the second thread 117 is wound across the movable rollers 110a, 110c in direction B at speed $s_2$. Solvents are introduced to the threads 106, 117 by chemical baths 116, 126, as described above. The movable rollers 110a, 110b, 110c are actuated to bring the threads 106, 117 into contact with the web 102 at the region that it passes over the roller 104. The movable rollers are also actuated normally (or in a direction non-parallel) to the web direction A in order to correct for a mis-alignment or changing position of the web during its transport. This actuation can be provided by a vision system controlled actuator (e.g. a stepper motor or/and piezo).

The first thread 106 thus creates a channel in the hole collection layer 18 and the photoactive layer 14, by solvation of the layers 14, 18 as described above in relation to FIG. 4. Similarly, the second thread 117 creates an adjacent, continuous channel in the hole collection layer 18, but not the photoactive layer 18.

The spray coating nozzle 128 is then activated to apply a silver nanoparticle solution to the web 102 (although it may, of course, be activated to continuously apply the solution to the web), the second thread 117 masking the channel it has made from being coated by the solution. As the solution dries to form a new electrode layer, the second thread 117 is wound onto the fourth bobbin 124.

As would be understood by one skilled in the art, it is possible to use three or more threads adjacent each other according to the methods outlined in relation to FIGS. 1 and 2, thereby enabling the formation of adjacent, e.g. continuous or contiguous channels in a plurality, e.g. three or more layers of an article.

Figure 3:
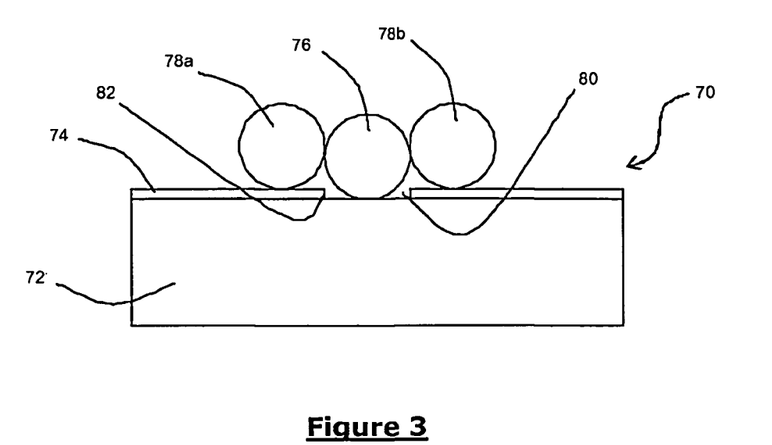
FIG. 3 shows steps of a method according to the invention.

A further refinement of the invention is shown in FIG. 3, which shows a web 70 comprising a substrate 72 having a thin film 74 applied to a major surface thereof.

A channel 80 is provided through the thin film 74 by dragging a first thread 76 flanked by auxiliary threads 78a, 78b across its surface as described above. The first thread is saturated in a first solvent in which the thin film 74 has high solubility. The auxiliary threads are contacted with, e.g. immersed, soaked or saturated in a liquid which is immiscible with the first solvent and in which the thin layer 74 has extremely low solubility.

The effect of this arrangement is that the first solvent is prevented from wicking from the first thread 76 through the thin film 74, thereby preventing partial dissolution of the film 74 at the edges leading to a variation of the thickness at the edges 82 of the channel 80. Such a method therefore provides extremely precise channels.

A further refinement of the invention, shown in FIG. 4, provides an additional or alternative means for deploying solvents and solvent mixtures onto the threads.

Rather than entering a chemical bath, as described in relation to FIG. 2, a wetting system 200 allows a thread 150 to be contacted with a pair of gravure rolls 152, 153.

The first gravure roll 152 is positioned in a first bath 154 of a first solvent 156, the first solvent being selected to solvate a first layer (say, a hole collection layer) of a device or precursor thereof.

The second gravure roll 153 is positioned in a first bath 158 of a first solvent 160, the first solvent being selected to solvate a first layer (say, a hole collection layer) of a device or precursor thereof.

Each gravure roll 152, 153 comprises a number of print surfaces 162 for transferring the solvents 156, 160 from the baths 154, 158 to the thread 150.

In use, the thread 150 is moved across the gravure rolls 152, 153 in a direction C, as the rolls 152, 153 are turning, such that the print surfaces 162 of the rolls 152, 153 apply alternate, preferably contiguous regions 164*a*, 164*b* of the solvents 156, 158 to the thread 150.

Such a thread 150 is thus able to remove adjacent layers having orthogonal solubility from an article, even if the solvents required to remove each layer are immiscible and therefore unable to be deployed as a mixture.

Moreover, it is possible to, e.g. prepare a first portion of a thread that carries only the first solvent, followed by a second portion of the thread bearing the second solvent that contacts the article only once the first layer has been removed, thereby saving solvent wastage.

It is also envisaged that three or more solvents or solvent mixtures may be applied to a thread by three or more gravure rolls.

Moreover, a single gravure roll may be deployed to apply a single solvent or solvent mixture to a thread. This single solvent may be applied in a continuous fashion, or in a series of distinct regions along the thread.

The segmented application of solvents or etch solutions may be additionally or alternatively performed by a dispenser or ink jet nozzle. Such techniques allow the precise deposition of a well defined volumes.

Figure 5:
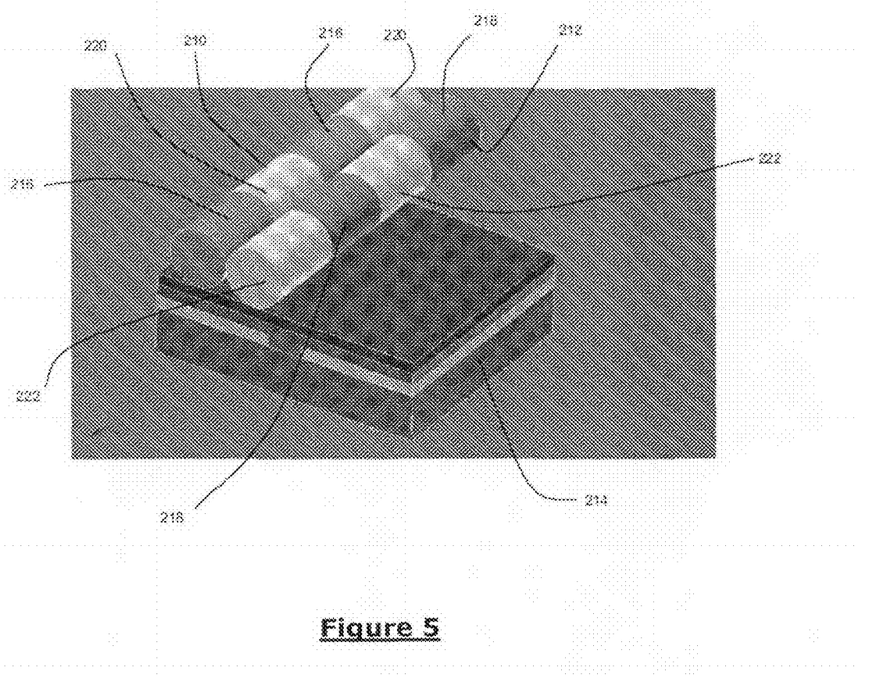
FIG. 5 shows apparatus according to the invention.

FIG. 5 shows a pair of threads 210, 212 parallel to and adjacent each other, ready to remove a stepped channel from layers of a web 214, in the manner described in relation to FIG. 4.

The threads 210, 212 each comprise a series of solvent sections 216, 218, such as may be applied by the method described above, and solvent free sections 220, 222 disposed between them. The threads 210, 212 are aligned such that the solvent sections 216 of the first thread 210 are positioned immediately adjacent the solvent free sections 222 of the second thread 212 and vice versa. Such an arrangement prevents undesired mixing of the solvents between the threads.

Moreover, the skilled person understands that this arrangement for applying solvent to threads would be equally appropriate when patterning a substrate using a single thread.

Moreover, rather than apply a solvent to the thread 20, it is possible to apply an acid or base solution and/or an abrasive material to the thread 20, in order to pattern a substrate such as a thin film electrode by reaction, corrosion or abrasion.

In some embodiments, threads may be used to apply substances or compositions suitable for forming self-assembled monolayers (SAMs) to a substrate. Such SAMs may be used to prevent wetting of the substrate in the area treated and as such can be applied before the application of a thin film to a substrate, preventing deposition of the film in those areas.

Figure 6A:
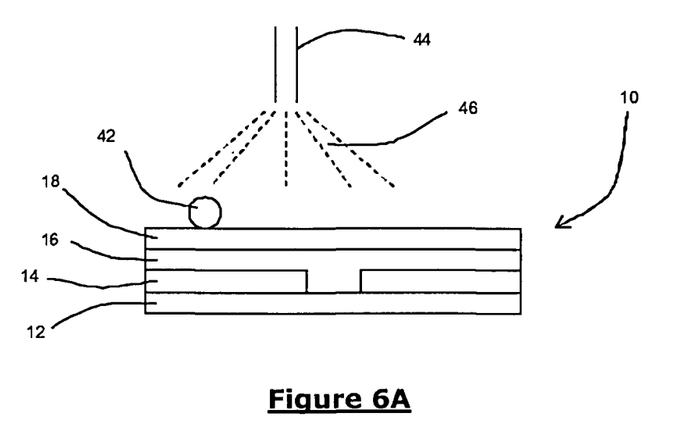
FIGS. 6A and B shows steps of a method according to the invention.
Figure 6B:
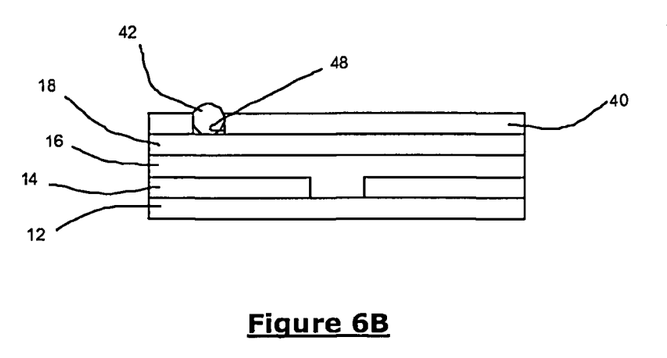

A further embodiment of the invention is shown in FIG. 6A,B which can be used in a number of scenarios in the patterning of an article. In this case, a web 10 is provided, the web comprising in series a substrate 12, a transparent electrode layer electrode 14, a photoactive layer 16 and a hole collection layer 18.

In order to add a further electrode layer 40, to provide the required sheet conductance, as well as reflector properties to the web 10 atop the hole collection layer 18, a thread 42 is placed in contact with the hole collection layer 18. A spray nozzle 44 is opened or actuated to spray a silver nanoparticle solution 46 onto the surface of the hole collection layer 18. The thread 42 masks a portion of the surface of the hole collection layer 18 from the incident silver nanoparticle solution 46, such that as the second electrode layer 40 is formed, a channel 48 is formed therein.

Once the second electrode layer 40 has dried sufficiently to have structural integrity, the thread 42 may be removed, leaving a completed second electrode layer 40.

Blade coating or slot-die coating may also be utilised to add e.g. a further electrode to a web 10. In such instances, an applied thread might not only mask a portion of the web 10 from the applied solution, but may also provide a guide for the height of the applied electrode.

Figure 7A:
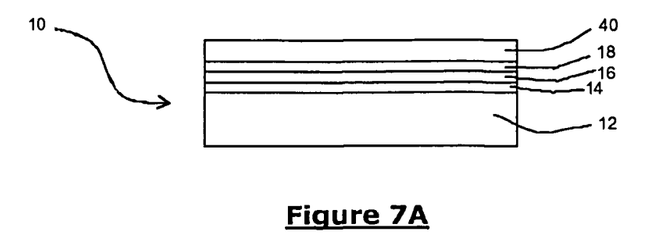
FIGS. 7A to C shows steps of a method according to the invention.
Figure 7B:
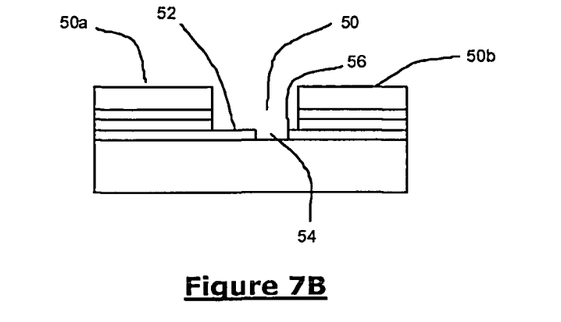
Figure 7C:
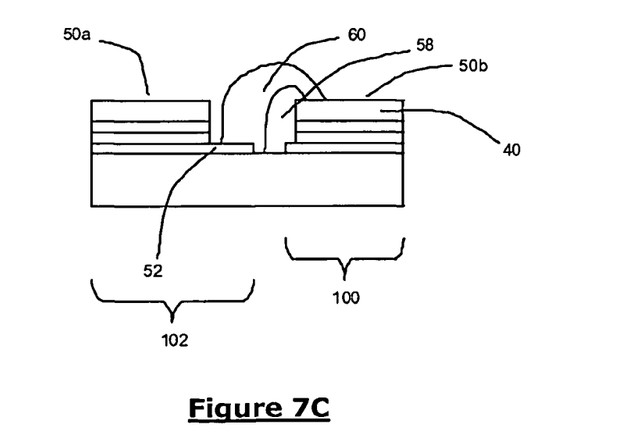

A further embodiment of the invention is shown in FIG. 7.

As shown in FIG. 7A, a web 10 is provided, the web comprising in series a substrate 12, a transparent electrode layer electrode 14, a photoactive layer 16, a hole collection layer 18, and a further electrode 40.

As shown in FIG. 7B a channel 50 through the further electrode 40, the hole collection layer 18 and the photoactive layer 16 is removed from the web 10 according to the methods described in relation to FIG. 1, to selectively leave a first 52 portion of the transparent electrode 14 intact adjacent a subchannel 54 through the transparent electrode 14.

A second portion 56 of the transparent electrode 12, the other side of the subchannel 54 to the first portion 52, may also be left intact by this procedure.

As shown in FIG. 7C, a passivation agent 58, such as a dielectric agent or oxidation agent, is deposited on the edge of the channel 50 to cover the edge of the right (as shown) cell element 100, but not covering the edge of the (as shown) left cell element 102 and, specifically, the opposing electrode 52 completely, so as to prevent short circuits between the top electrode 50*b* and the underlying bottom electrode 14 of the right cell element 100 caused by the subsequent deposition of the electrical interconnection material 60. This may be achieved by e.g. masking the first side 50*a* of the channel 50 and applying (for example printing or deposition via a thread or a segment on the thread) the passivation agent into the channel to ensure that the second side 50*b* of the channel 50 is passivated.

An electrical interconnect 60 (e.g. a solution of silver nanoparticles) is then deposited onto the passivation agent 58 to effect an electrical connection between the further electrode 40 on the second side 50*b* of the channel 50 (i.e. the left cell element 102) and the first portion 52 of the transparent electrode 12 (i.e. the right cell element 100). A gap must remain between the electrical interconnect 60 and the electrode 50*a* so as to ensure that there is no short circuit of the left cell element 102.

A substantial advantage of this method is that all of the layers can be laid down without pre-patterning (which necessitates accurate and therefore time consuming and/or expensive set up procedures) and using well established bulk techniques. Each layer may be provided across the entire sheet and the whole sheet or web (or a part of it) can be subsequently patterned. This can lead to substantial time and cost savings.

Figure 8:
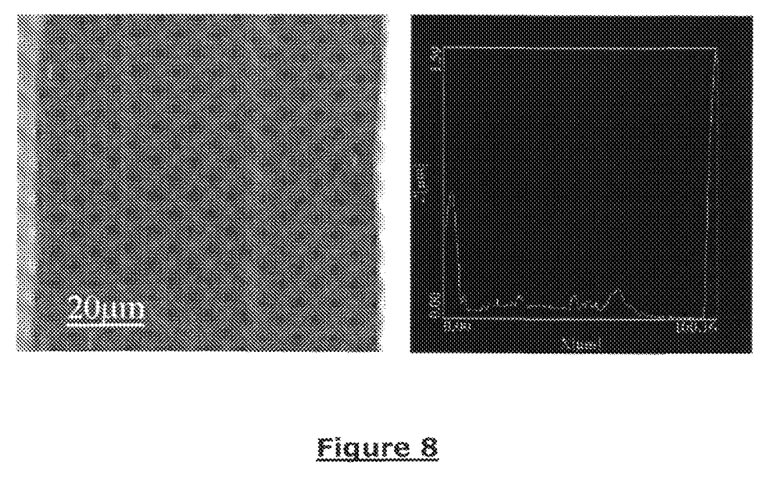
FIG. 8 shows an article according to the invention.

By way of Example, a patterned line in a photoactive layer is given in shown in FIG. 8. AFM measurements on the obtained structures show, in this embodiment, groove widths of 90 micrometers with well defined edges.

No doubt many other effective alternatives will occur to the skilled person. For example, while the embodiments described above are primarily concerned with the use of threads carrying solvents such as toluene, xylene, chlorobenzene and alcohols to assist in the removal of organic species from a web, other functions for the threads are envisaged.

Of course, as would be understood by one skilled in the art, changes to the operation of the system 26 shown in FIG. 2 may offer different finishing effects. For example, it is preferred that the speed s of the movement of the thread 20 in direction B is greater than the speed v of the movement of web 10 in the direction A, so as to carry dissolved matter away from the web 10. However, it is envisaged that the speed s and the speed v could be the same or that the speed s could be smaller than the speed v. In other preferred embodiments, the directions A and B could be opposing at the point of contact between the thread 20 and the web 10. In most embodiments a contra-flowing motion is preferred. Of course, this may necessitate moving the position of the baths such that the baths are upstream of the contact area.

Metal electrodes, such as aluminium, gold, silver, chromium and copper electrodes, and conducting e.g. transparent oxide electrodes such as indium tin oxide and aluminium doped zinc oxide, may be etched using the above described methods utilising threads carrying specific acid or base solutions.

Self assembled monolayers may be applied to the surface of substrates, for example to alter the surface energy thereof, by utilising threads carrying suitable species, such as haloalkylsilanes including octyl-trichlorosilane.

In further embodiments, the threads may be used to abrade layers from the surface of substrates. Such abrasive threads may, for example, be coated with and/or carry abrasive slurries.

Threads will typically be from 20 to 200 microns in diameter (or other cross thread dimension), but may be thinner (e.g. 1 to 20 microns) or thicker (e.g. 1 to 10 mm).

In this specification, the term "adjacent" when used to describe the proximity of the threads, refers to the threads abutting each other or being separated by a short distance, for example no more than 3 (e.g. no more than 2, 1 or 0.5) thread widths.

In some embodiments, the process and/or apparatus may be used to manufacture an array of electronic devices, for example by providing a plurality of parallel and spaced threads or groups of threads to etch a large web of material.

It will be understood that the invention is not limited to the described embodiments and encompasses modifications apparent to those skilled in the art lying within the spirit and scope of the claims appended hereto.

The invention claimed is:

1. A method for patterning an article comprising a first layer of a first material, a first surface of the first layer being in intimate contact with at least a portion of a first surface of a second layer of a second material that is different from the first material, the method comprising:
   providing a first thread carrying a first solvent within which the first material is soluble;
   providing a second thread aligned with and adjacent the first thread, the second thread carrying a second solvent within which the first material is soluble and within which the second material is relatively more soluble than the first material;
   contacting the first and second threads with the first layer of the article and thereby solvating the first material to remove at least part of the first layer and to provide a channel therethrough; and
   contacting the second thread with the second layer of the article and thereby solvating the second material to remove at least part of the second layer and provide a channel therethrough.

2. A method according to claim 1, further comprising removing the first thread from contact with the article, depositing a third different material onto the article to create a third layer in intimate contact with the first layer, and removing the second thread to leave the channel through the first, second and third layers.

3. A method according to claim 2, wherein the third material is deposited by a method selected from the group consisting of spray coating, ultra sonic spray coating, ink-jet printing, blade coating, screen printing, reverse gravure coating, gravure printing, off-set printing, slide coating, curtain coating, and dip coating.

4. A method according to claim 2, wherein the third material comprises a material selected from the group consisting of metals, metal oxides, doped semiconductors, undoped semiconductors, and precursors, nanoparticles or microparticles thereof, graphenes, carbon black, and carbon nanotubes.

5. A method according to claim 2, further comprising applying a passivating material to the channel through the first, second and third layers.

6. A method according to claim 5, further comprising applying the passivating material to cover an exposed bottom electrode in intimate contact with the second layer.

7. A method according to claim 5, wherein the passivating material is a dielectric material and/or oxidising agent.

8. A method according to claim 2, further comprising applying a conducting material into the channel through the first, second and third layers.

9. A method according to claim 8, further comprising applying the conducting material so as to provide a conducting path between at least two of the first, second, and third layers at either side of the channel through the first, second and third layers.

10. A method according to claim 9, further comprising providing electrical contact between a top electrode in intimate contact with the first layer and a bottom electrode in intimate contact with the second layer of cell elements at either side of the channel through the first, second and third layers to form a series interconnection of the cell elements.

11. A method according to claim 8, wherein the conducting material comprises a material selected from the group consisting of metals, metal inks, doped organic and inorganic conductors and precursors, nanoparticles or microparticles thereof, graphenes, carbon black, carbon nanotubes.

12. A method according to claim 6, wherein the bottom electrode comprises a charge injection layer and a conductor layer.

13. An apparatus for patterning an electronic device, the apparatus comprising:
   a first thread;
   at least two guides for mounting the first thread and providing a region of the first thread for contacting an article comprising a first layer of a first material, a first surface of the first layer being in intimate contact with at least a portion of a first surface of a second layer of a second different material, the at least two guides comprising rollers for guiding the first thread in a lengthwise direction;
   a third guide, which in concert with a first of the at least two guides or a fourth guide, is adapted to guide a second thread lengthwise and/or provide a region of the second thread for contacting the article;
   means for applying a first solvent to the first thread in which the first material is soluble before it contacts the article; and
   means for applying a second solvent to the second thread in which the first material is soluble before it contacts the article, the second different material being relatively more soluble than the first material in the second solvent.

14. The apparatus according to claim 13, wherein the guides are movable to adjust the contact position of the first and/or second threads with the article.

15. The apparatus according to claim 14, wherein the guides are continuously and/or automatically movable.

16. The apparatus according to claim 13, further comprising means for applying a material to the article before, during and/or after the first thread contacts the article.

17. The apparatus according to claim 13, wherein the means for applying the first solvent to the first thread and the means for applying the second solvent to the second thread comprise one or more gravure rolls.

\* \* \* \* \*